INVENTORS
ROBERT A. HERREMAN
JAMES K. ROBERTS
BY Hobbs & Easton
ATTORNEYS

INVENTORS
ROBERT A. HERREMAN
JAMES K. ROBERTS
BY Hobbs & Caston
ATTORNEYS

PRODUCTION OF PRINTED CIRCUIT BOARDS AND THE LIKE

Filed Jan. 21, 1963 4 Sheets-Sheet 3

INVENTORS
ROBERT A. HERREMAN
JAMES K. ROBERTS
BY Hobbs & Easton
ATTORNEYS

PRODUCTION OF PRINTED CIRCUIT BOARDS AND THE LIKE

Filed Jan. 21, 1963 4 Sheets-Sheet 4

INVENTORS
ROBERT A. HERREMAN
JAMES K. ROBERTS
BY Hobbs & Easton
ATTORNEYS

United States Patent Office 3,247,761
Patented Apr. 26, 1966

3,247,761
PRODUCTION OF PRINTED CIRCUIT BOARDS AND THE LIKE

Robert A. Herreman, 1102 Chester St., and James K. Roberts, 2228 Portage Ave., both of South Bend, Ind.
Filed Jan. 21, 1963, Ser. No. 252,963
10 Claims. (Cl. 88—24)

The present invention relates to the production of printed circuit boards and the like, and more particularly to an apparatus and method for producing photographically printed circuit boards and other similar articles.

The conventional process of producing printed circuit boards consists in chemically etching a copper coated base board, in which the copper coating is given a chemically inert coating representing the desired circuit and is then chemically treated to etch away the portions thereof unprotected by the inert coating, thus leaving the portions forming the circuit. The circuit paths are interrupted from place to place for receiving various components, which bridge the gap between the adjacent circuit sections and thus complete the circuit and impart the required electrical characteristics to the circuitry. In this conventional process, after the circuit has been produced by etching, the components, such as for example, resistors, diodes and capacitors, are secured to the board and connected into the circuit, usually by hand soldering. The standard circuit board generally has the etched circuit disposed on only one side of the board, but it may be etched from copper coating on both sides thereof, and the components may be mounted on either or both sides of the board regardless of whether or not the printed circuit is on only one side.

In standard practice, the procedure followed in producing the circuit paths initially for receiving the chemically inert coating has been to lay out and draw by one form or another the circuit pattern several times larger than the ultimate size of the printed circuit, using ink or plastic tape, and then reducing to the required size photographically, in order to minimize the errors normally associated with hand work. This procedure, however, is tedious, time consuming and still inherently inaccurate and generally expensive, requiring much or all of the circuitry to be drawn each time a new or substantially different circuit is produced, thus further increasing the production costs. It is therefore one of the principal objects of the present invention to provide a novel apparatus for producing printed circuits and the like by a photographic process, which can rapidly and accurately perform the circuit layout operation automatically, and which can duplicate the desired circuit and various modifications thereof without any substantial time consuming or expensive operations.

Another object of the invention is to provide an apparatus for laying out printed circuits and the like involving a photographic process, in which a preselected pattern is applied to a sensitized plate in progressive steps controlled by a pre-punched or marked tape, or the like, fed into the apparatus control mechanism, and which can be operated to perform the process without any special skills of a highly trained operator being required.

Still another object of the invention is to provide a method of producing printed electrical circuit boards and the like in which the desired circuit paths are created on a sensitized plate by a series of progressive steps performed in accordance with a preselected control pattern, and which can be rapidly, accurately and inexpensively performed without highly skilled and trained personnel.

The present apparatus and method involves the use of a plurality of circuit segments of preselected geometrical shapes in the form of light rays projected momentarily and progressively onto a sensitized photographic plate in accordance with a preselected pattern fed into a control mechanism. The control mechanism selects both the particular shape of geometrical light ray and the particular and exact location on the sensitized plate for receiving the momentary exposure of light ray. By the successive steps of the light ray exposures, which in effect are circuit segments, the desired circuit paths are formed. In addition to the formation of the circuit paths, certain components of standard characteristics may be likewise produced and inserted photographically and progressively as the circuit paths are constructed. The present invention and further objects and advantages thereof will be more fully set forth in the following description and accompanying drawings, wherein:

Figure 11:
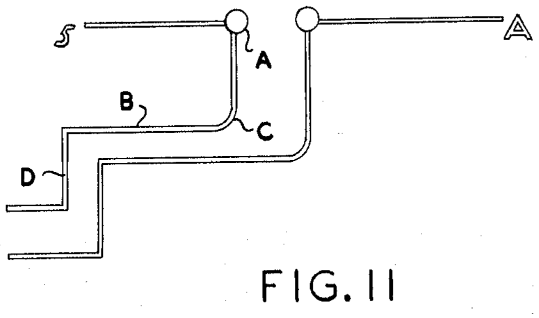
Figure 5:
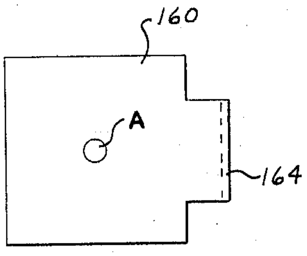
Figure 6:
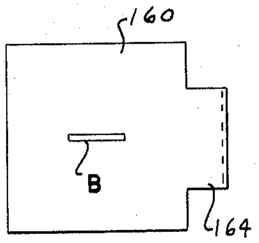
Figure 7:
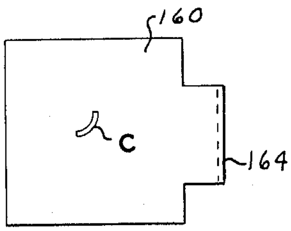
Figure 8:
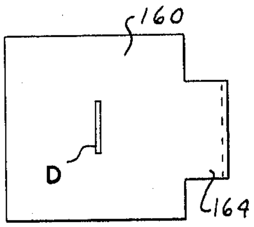
Figure 9:
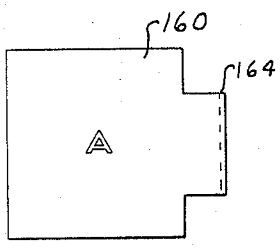
Figure 10:
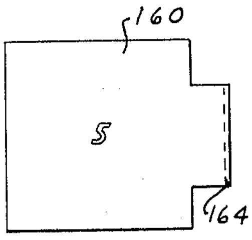

FIGURES 5, 6, 7, 8, 9 and 10 show removable pattern plates for producing a predetermined light ray configuration, FIGURE 5 showing a round opening, FIGURE 6 a horizontal slot, FIGURE 7 a curve, FIGURE 8 a vertical slot, and FIGURES 9 and 10 a letter and a numeral or component; and FIGURE 11 is a diagrammatic view of a fragmentary portion of a circuit, illustrating the manner in which the present apparatus operates.

Figure 1:
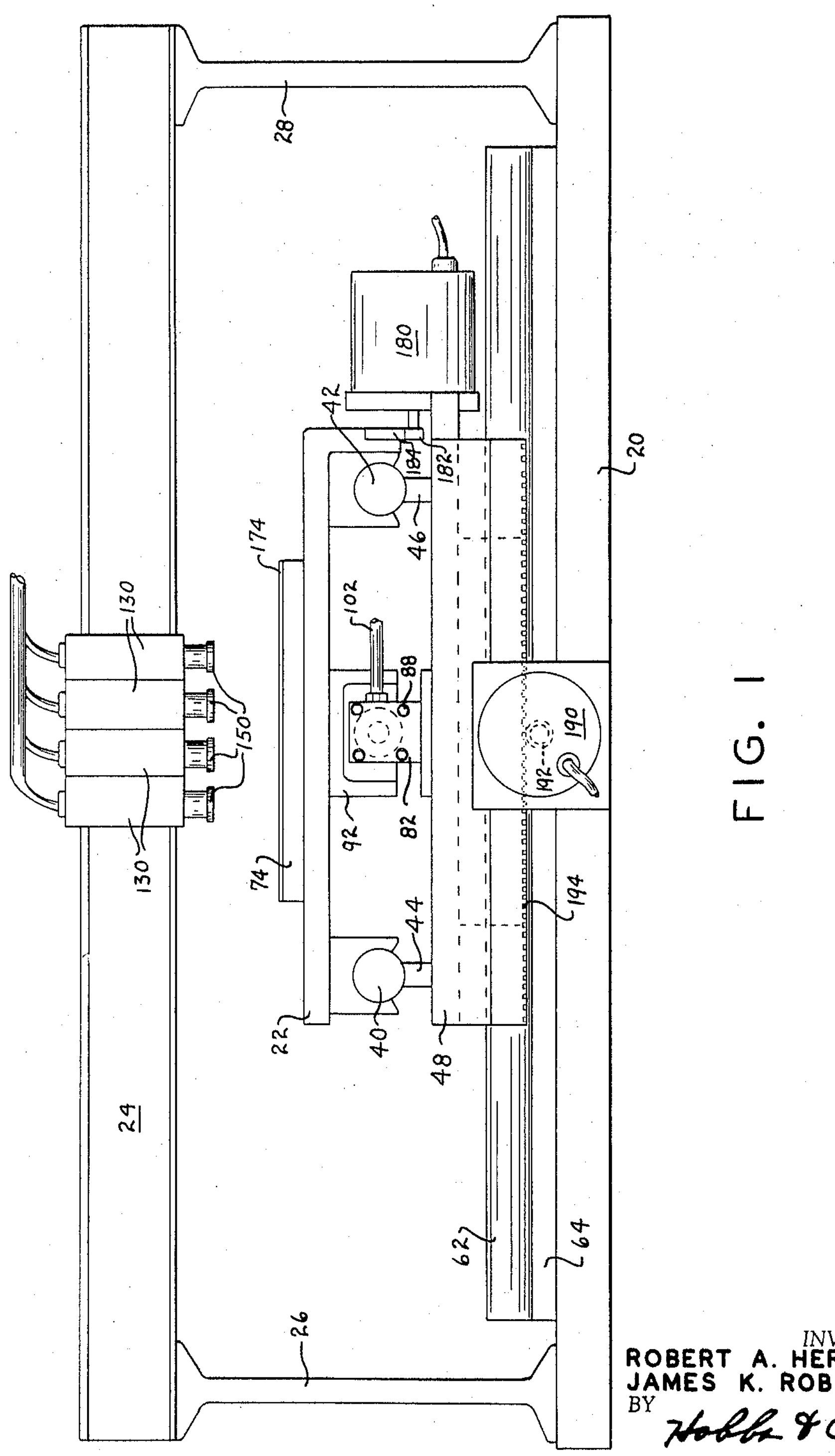
FIGURE 1 is a front elevational view of an apparatus embodying the present invention.
Figure 2:
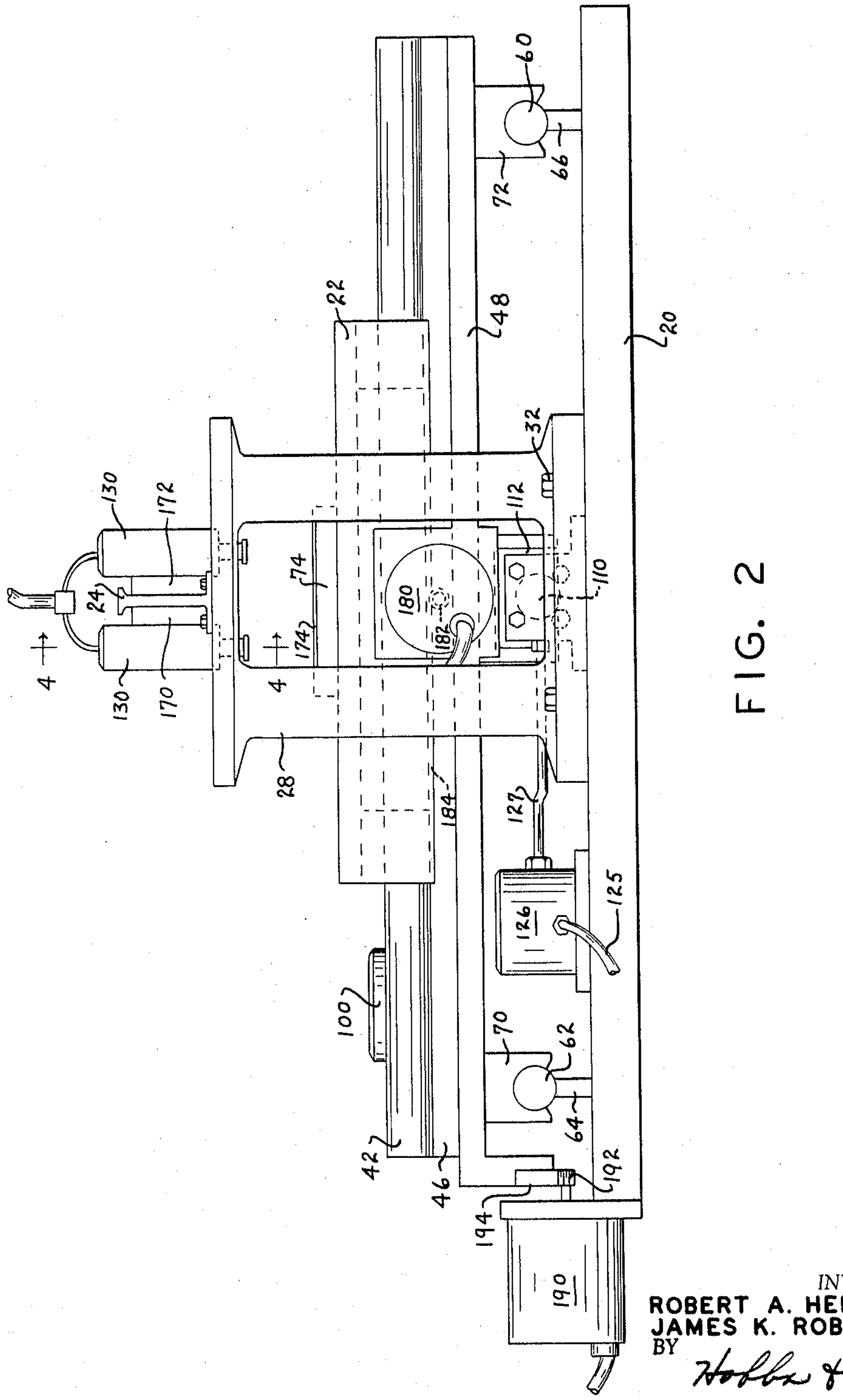
FIGURE 2 is a side elevational view of the apparatus shown in FIGURE 1.
Figure 3:
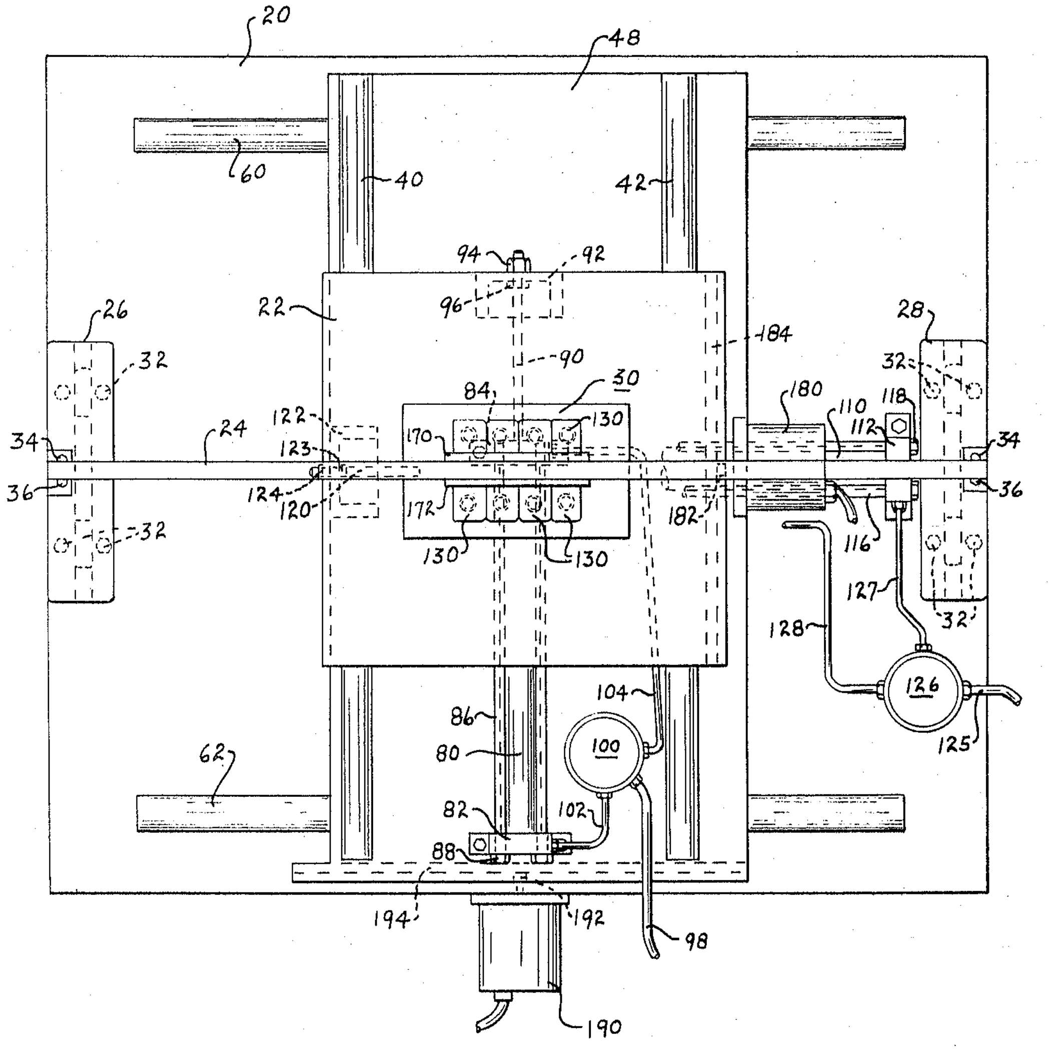
FIGURE 3 is a top plan view of the apparatus shown in FIGURES 1 and 2.

Referring more specifically to the drawings, and to FIGURES 1, 2 and 3 in particular, numeral 20 designates a base, and 22 a table supported on said base by carriages for positioning table 22 at right angles on X and Y axes. Numeral 24 designates a beam, which together with end supports 26 and 28, forms a bridge for supporting a bank 30 of light projection devices hereinafter more fully described.

The base 20 is preferably constructed of a heavy rectangular metal plate to which end support members 26 and 28 are rigidly secured by a plurality of bolts 32 extending downwardly through the base of members 26 and 28 and through or into threaded holes in base 20. Beam 24 is spaced upwardly from the top of table 22 and is supported by and secured to end members 26 and 28 by bolts 34 and 36 at each end of the beam. The base may be produced as a separate unit adapted to support the mechanism previously described and may be supported on legs or any other suitable type of base or supporting means, preferably at such a level above the floor as to place the upper surface of table 22 within easy reach of an operator.

Table 22 is mounted on X and Y axes, the X axis consisting of two parallel round bars 40 and 42 supported by blocks 44 and 46, respectively, on a tray 48, the tray being formed of rigid metal construction of sufficient strength to firmly support table 22 and tracks 40 and 42.

The Y axis, which is at right angles to the X axis, consists of tracks 60 and 62 supported by blocks 64 and 66 on base 20, the blocks being firmly secured to the base by bolting or other suitable securing means. Tracks 60 and 62 firmly support tray 48, tracks 40 and 42 and table 22 for movement of the table along the Y axis. The tray rides on and is supported by bearings 70 and 72 secured to the underside of the tray and journalled on tracks 60 and 62. The tracks 40 and 42 of the X axis and 60 and 62 of the Y axis are of sufficient length to permit the effective central area of the table to be positioned throughout its length and breadth beneath all of the light projection devices of bank 30. The effective area to be positioned below the light projection devices of bank 30 consists, in the embodiment shown in the drawings, of a raised block 74 secured to the upper surface of table 22 by screws, or any other suitable securing means. The block 74 may be replaced by various sized blocks depending upon the desired circuit board being prepared by the apparatus, and the sensitized plate is removably secured by any suitable means to the upper surface of block 74.

In the embodiment of the invention illustrated in the drawings, table 22 and tray 48 are moved on axes X and Y, respectively, by a hydraulic system. Table 22 is moved in the forward and rearward directions by a cylinder 80 secured at one end to the upper surface of tray 48 by an end member 82 and at the other end by end member 84, the two end members 82 and 84 being tied together and in sealing relation with cylinder 80 by a plurality of rods 86 extending through the two blocks and receiving nuts 88 on the threaded ends thereof. The piston in cylinder 80 is connected to the underside of table 22 by rod 90 extending outwardly through the end of the cylinder and secured to one edge of the table by a bracket 92 and nuts 94 and 96 threaded onto the end of the rod. The bracket 92 is either formed integrally with table 22 or secured thereto by a plurality of bolts, not shown. The hydraulic fluid is supplied to cylinder 80 through hydraulic line 98, a three-way servo valve 100 connected to one end of cylinder 80 by hydraulic line 102 and through end member 82, and to the other end of cylinder 80 by hydraulic line 104 and through end member 84. It is thus seen that cylinder 80 is a two-way hydraulic cylinder for moving table 22 in both directions on tracks 40 and 42 throughout the length of the X axis.

Tray 48 is moved in the two directions along the Y axis by a cylinder 110 secured at one end to the upper surface of base 20 by an end member 112 and at the other end by a similar end member (not shown), the two end members being tied together and in sealing relation with cylinder 110 by a plurality of rods 116 extending through the two end members and receiving nuts 118 on the threaded ends thereof. The piston in cylinder 110 is connected to the underside of tray 48 by rod 120 extending outwardly through the end of the cylinder and secured to one edge of the tray by a bracket 122 and nuts 123 and 124 threaded onto the end of the rod. The bracket 122 is either formed integrally with tray 48 or secured thereto by a plurality of bolts, not shown. The hydraulic fluid is supplied to cylinder 110 through hydraulic line 125, a three-way servo valve 126 connected to one end of cylinder 110 by hydraulic line 127 through end member 112 and to the other end of cylinder 110 by hydraulic line 128 and through the respective end member. Cylinder 110 is likewise a two-way hydraulic cylinder for moving tray 48 in both directions on tracks 60 and 62 throughout the length of the Y axis.

Figure 4:
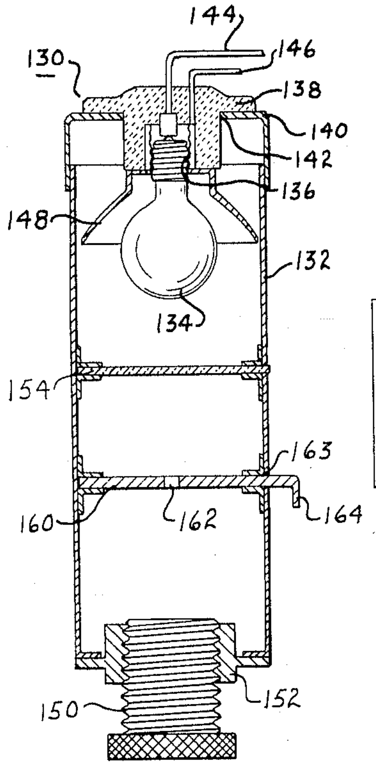
FIGURE 4 is a vertical cross sectional view through a light projection device forming a part of the apparatus shown in the preceding figures.

The individual light projection devices 130 of bank 30 may be of various constructions, one form being illustrated in FIGURE 4 and consisting of a rectangular housing 132, a light bulb 134 seated in light socket 136 and holder 138, the holder being supported by upper end member 140 and extending downwardly through hole 142 in the upper end member. The socket is connected by leads 144 and 146 to an electrical circuit. A reflector 148 is mounted above light bulb 134 and is secured to the lower end of holder 138. Mounted in the lower end of the projection device 130 is a focusing lens 150 threadedly received in insert 152 secured to the lower end of housing 132. Rotation of the lens upwardly and downwardly permits accurate focusing of the light beam on the photosensitive plate. A light diffuser 154 is preferably inserted between the bulb and the lens. The bulb and diffuser are of well known construction and are considered as conventional as far as the present invention is concerned. Inserted between diffuser 154 and lens 150 is a pattern plate 160 of metal or other opaque material having an opening or slot 162 forming a desired light ray configuration. FIGURES 5 through 10 illustrate various configurations which may be used in the production of various printed circuits. Plate 160 is inserted in a slot 163 and is provided with a tongue 164 forming a handle for inserting and removing the plate from slot 163. In FIGURE 5 the plate 160 is provided with a round hole A, in FIGURE 6 a horizontal slot B, in FIGURE 7 a 90° arc C, in FIGURE 8 a vertical slot D, and in FIGURES 9 and 10 the letter "A" and numeral "5." Various letters and numerals and other types of designations may be used, if desired. The light ray configurations of FIGURES 5 through 10 are used to form a pattern on the sensitized plate, such as that illustrated in FIGURE 11, and various parts of the pattern formed by the different plates are identified by letters A, B, C and D. The light projection devices 130 are mounted on brackets 170 and 172 which in turn are rigidly secured to beam 24. These light projection devices contain the various pattern plates illustrated in FIGURES 5 through 10 and, as shown in the drawings, project their beams directly downwardly onto the sensitized plate illustrated by numeral 174 mounted by any suitable means on block 74. The devices, however, may be positioned to focus their beams at a common point on the sensitized plate 174, although in the latter type of installation, the beam thus projected, unless compensated for, may be slightly distorted, though not to the extent to seriously interfere in the production of satisfactory plates for the printed circuit.

The positioning of table 22 on the X and Y axes by hydraulic cylinders 80 and 110 to produce a circuit such as that illustrated in FIGURE 11 is controlled by any one of several different types of control mechanisms, such as the well known and extensively used perforated tape on which a program has been prepunched preparatory to producing the desired circuit. Since the perforated tape type control mechanism is well known and the details of the mechanism constituting that type of control do not form a direct part of the present invention, the control mechanism will not be described in detail herein. The accurate positioning of table 22 on the X axis is determined by positioning sensing device 180 in conjunction with pinion 182 and rack 184 connected to one edge of table 22. As table 22 is moved along the tracks 40 and 42 on the X axis, pinion 182 is rotated by rack 184 and the movement and position of table 22 are transmitted through the senser to the control mechanism (not shown). The accurate positioning of tray 48 on the Y axis is determined by positioning sensing device 190 in conjunction with pinion 192 and rack 194 connected to one edge of tray 48. As tray 48 is moved along the tracks 60 and 62 on the Y axis, pinion 192 is rotated by rack 194 and the movement and position of tray 48 are transmitted through the senser to the control mechanism.

The operation of the present apparatus for production of printed circuit boards and the like, and the method performed thereby, are believed to be apparent from the foregoing description; however, the operation will be briefly described. The machine is enclosed in a dark room or under a suitable cover, and a light sensitive plate 174 is secured to the upper surface of block 74. A tape of the desired program is inserted in the master control mechanism which proceeds to move block 74 on both the X and Y axes by controlling hydraulic cylinders 80 and 110 to shift table 22 on the X axis and tray 48 on the Y axis to the various predetermined positions. At each position, one of the light projection devices 130 is momentarily flashed on, creating an imprint on the light sensitive plate 174 corresponding to one of the light ray slots A, B, C or D, shown in FIGURES 5, 6, 7 and 8. The table is then moved to the next position, along the X and/or Y axis, and thereafter another light projection device is operated to produce the desired line configuration. This operation is repeated until the entire circuit board layout has been produced on the sensitized plate 174 as determined by the master control mechanism. Various other configuration, such as the A and 5, shown in FIGURES 9 and 10, as well as certain simplified components or other frequently used line configurations, may be created by this operation with the flash of one or more projection devices. After the sensitized plate 174 has been fully exposed to the circuit pattern, the plate is then developed in the well known manner for the purpose of producing an inert protective coating corresponding to the circuit pattern on a copper base board in the conventional manner.

When a plurality of light projection devices are used in bank 30 and are focused directly downwardly onto the plate 174, the table must not only shift to the next succeeding position, but also must select the position for the particular light projection device required. It is thus seen that the control for the bank of projection devices operates in conjunction with the positioning of table 22 to create the desired light ray configuration at each position. Further, a single light projection device may be used to form certain printed circuit configurations and if desired the plate may be held stationary and the projection device or devices moved rather than the table. Movement other than those on the X and Y axes, such as a rotary movement, may be used to position either the plate or projection device relative to one another. In some instances, the sensitized plate may be the circuit board itself rather than a separate plate or film as described above.

While only one embodiment of the present invention has been described in detail herein, various changes and modifications may be made to satisfy requirements.

We claim:

1. An apparatus for use in producing printed circuit boards and the like, comprising a base having a flat upper surface, a pair of spaced parallel tracks mounted on said base, a tray mounted on said tracks for movement thereon, a hydraulic cylinder for moving said tray to and fro on said tracks in any successive positioning operation, a position sensing means including a rack mounted on said tray and a pinion rotated by the movement of said rack with said tray, a pair of spaced parallel tracks mounted on said tray at right angles to said first mentioned tracks, a table mounted on said second mentioned tracks for movement thereon, a hydraulic cylinder for moving said tray to and fro on said tracks in any successive positioning operation, a position sensing means for said table including a rack mounted on said table and pinion rotated by the movement of said rack with said table, said table having a station for receiving and positioning a photosensitive plate thereon, at least three light projection devices for focusing momentarily a beam of light of predetermined configurations and in a predetermined pattern on said station to sensitize on said plate a configuration connected to a preceding sensitized configuration, each of said devices including a source of light, a diffusion glass, a focusing lens and a pattern plate of the desired light beam configuration disposed between said diffusion glass and said lens, the pattern plate of one of said devices having an elongated slot, the pattern plate of another of said devices having an elongated slot at right angles to said first mentioned slot, and the pattern plate of still another of said devices having a round hole, the slots of said second devices being so positioned with respect to said first slot as to project an image perpendicular and connected to the image produced by said first slot, a support beam, and two end support members therefor mounted on said base for positioning said light projection devices in spaced relation to said table.

2. An apparatus for use in producing printed circuit boards and the like, comprising a base, a pair of spaced parallel tracks mounted on said base, a tray mounted on said tracks for movement thereon, a means for moving said tray to and fro on said tracks in any successive positioning operation, a position sensing means including a rack mounted on said tray and a pinion rotated by the movement of said rack with said tray, a pair of spaced parallel tracks mounted on said tray at right angles to said first mentioned tracks, a table mounted on said second mentioned tracks for movement thereon, a means for moving said tray to and fro on said tracks in any successive positioning operation, a position sensing means for said table including a rack mounted on said table and pinion rotated by the movement of said rack with said table, said table having a station for receiving and positioning a photosensitive plate thereon, at least three light projection devices for focusing momentarily a beam of light of predetermined configurations and in a predetermined pattern on said station to sensitize on said plate a configuration connected to a preceding sensitized configuration, each of said devices including a source of light, a focusing lens and a pattern plate of the desired light beam configuration disposed between said source of light and said lens, the pattern plate of one of said devices having an elongated slot, the pattern plate of another of said devices having an elongated slot at right angles to said first mentioned slot, the slots of said second devices being so positioned with respect to said first slot as to project an image perpendicular and connected to the image produced by said first slot, and a means for positioning said light projection devices in spaced relation to said table.

3. An apparatus for use in producing printed circuit boards and the like, comprising a base, a pair of spaced parallel tracks mounted on said base, a tray mounted on said tracks for movement thereon, a means for moving said tray to and fro on said tracks in any successive positioning operation, a position sensing means including a rack mounted on said tray and a pinion rotated by the movement of said rack with said tray, a pair of spaced parallel tracks mounted on said tray at right angles to said first mentioned tracks, a table mounted on said second mentioned tracks for movement thereon, a means for moving said tray to and fro on said tracks in any successive positioning operation, a position sensing means for said table including a rack mounted on said table and pinion rotated by the movement of said rack with said table, said table having a station for receiving and positioning a photosensitive plate thereon, a plurality of light projection devices for focusing a beam of light of predetermined configurations and in a predetermined pattern on said station to sensitize on said plate a configuration connected to a preceding sensitized configuration, one of said devices having means defining a horizontally positioned light slot, another of said devices having means defining a light slot positioned perpendicularly to said first light slot and being so positioned with respect to said first slot as to project an image perpendicular and connected to the image produced by said first slot, each of said devices including a source of light, a focusing lens and a pattern plate of the desired light beam configuration disposed between said source of light and said lens, and a means for positioning said light projection devices in spaced relation to said table.

4. An apparatus for use in producing printed circuit boards and the like, comprising a base, a pair of spaced parallel tracks mounted on said base, a tray mounted on said tracks for movement thereon, a means for moving said tray to and fro on said tracks in any successive positioning operation, a position sensing means, a pair of spaced parallel tracks mounted on said tray at right angles to said first mentioned tracks, a table mounted on said second mentioned tracks for movement thereon, a means for moving said tray to and fro on said tracks in any successive positioning operation, a position sensing means for said table, said table having a station for receiving and positioning a photosensitive plate thereon, a plurality of light projection devices for focusing a beam of light of predetermined configurations and in a predetermined pattern on said station to sensitize on said plate a configuration connected to a preceding sensitized configuration, one of said devices having means defining a horizontally positioned light slot, another of said devices having means defining a light slot positioned perpendicularly to said first light slot and being so positioned with respect to said first slot as to project an image perpendicular and connected to the image produced by said first slot, each of said devices including a source of light, a focusing lens and a pattern plate of the desired light beam configuration disposed between said source of light and said lens, and a means for positioning said light projection devices in spaced relation to said table.

5. An apparatus for use in producing printed circuit boards and the like, comprising a base, a pair of spaced parallel tracks mounted on said base, a tray mounted on said tracks for movement thereon, a means for moving said tray to and fro on said tracks in any successive positioning operation, a position sensing means, a pair of spaced parallel tracks mounted on said tray at right angles to said first mentioned tracks, a table mounted on said second mentioned tracks for movement thereon, a means for moving said tray to and fro on said tracks in any successive positioning operation, said table having a station for receiving and positioning a photosensitive plate thereon, a plurality of light projection devices for focusing a beam of light of predetermined configurations and in a predetermined pattern on said station to sensitize on said plate a configuration connected to a preceding sensitized configuration, one of said devices having means defining a horizontally positioned light slot, another of said devices having means defining a light slot positioned perpendicularly to said first light slot and being so positioned with respect to said first slot as to project an image perpendicular and connected to the image produced by said first slot, and a means for positioning said light projection devices in spaced relation to said table.

6. An apparatus for use in producing printed circuit boards and the like, comprising a base, a table mounted on said base for movement on axes at right angles to one another in any successive positioning operation, said table having a station for receiving and positioning a photosensitive plate thereon, at least three light projection devices for focusing momentarily a beam of light of predetermined configurations and in a predetermined pattern on said station to sensitize on said plate a configuration connected to a preceding sensitized configuration, each of said devices including a source of light, a diffusion glass, a focusing lens and a pattern plate of the desired light beam configuration disposed between said diffusion glass and said lens, the pattern plate of one of said devices having an elongated slot, the pattern plate of another of said devices having an elongated slot at right angles to said first mentioned slot and the pattern plate of still another of said devices having a round hole, the slots of said second devices being so positioned with respect to said first slot as to project an image perpendicular and connected to the image produced by said first slot, and a means for positioning said light projection devices in spaced relation to said table.

7. An apparatus for use in producing printed circuit boards and the like, comprising a base, a table mounted on said base for movement on axes at right angles to one another in any successive positioning operation, said table having a station for receiving and positioning a photosensitive plate thereon, at least three light projection devices for focusing a beam of light of predetermined configurations and in a predetermined pattern on said station to sensitize on said plate a configuration connected to a preceding sensitized configuration, each of said devices including a source of light, a focusing lens and a pattern plate of the desired light beam configuration disposed between said source of light and said lens, the pattern plate of one of said devices having an elongated slot, the pattern plate of another of said devices having an elongated slot at right angles to said first mentioned slot, the slots of said second devices being so positioned with respect to said first slot as to project an image perpendicular and connected to the image produced by said first slot, and a means for positioning said light projection devices in spaced relation to said table.

8. An apparatus for use in producing printed circuit boards and the like, comprising a base, a table mounted on said base for movement on axes at right angles to one another in any successive positioning operation, said table having a station for receiving and positioning a photosensitive plate thereon, a plurality of light projection devices for focusing a beam of light of predetermined configurations and in a predetermined pattern on said station to sensitize on said plate a configuration connected to a preceding sensitized configuration, one of said devices having means defining a horizontally positioned light slot, another of said devices having means defining a light slot positioned perpendicularly to said first light slot and being so positioned with respect to said first slot as to project an image perpendicular and connected to the image produced by said first slot, each of said devices including a source of light, a focusing lens and a pattern plate of the desired light beam configuration disposed between said source of light and said lens, and a means for positioning said light projection devices in spaced relation to said table.

9. An apparatus for use in producing printed circuit boards and the like, comprising a base, a table mounted on said base for movement on axes at right angles to one another in any successive positioning operation, said table having a station for receiving and positioning a photosensitive plate thereon, a plurality of light projection devices for focusing a beam of light of predetermined configurations and in a predetermined pattern on said station to sensitize on said plate a configuration connected to a preceding sensitized configuration, one of said devices having means defining a horizontally positioned light slot, another of said devices having means defining a light slot positioned perpendicularly to said first light slot and being so positioned with respect to said first slot as to project an image perpendicular and connected to the image produced by said first slot, and a means for positioning said light projection devices in spaced relation to said table.

10. In an apparatus for use in producing printed circuit boards and the like: a table, said table having a station for receiving and positioning a photosensitive plate thereon, a plurality of light projection devices for focusing a beam of light of predetermined configurations and in a predetermined pattern on said station to sensitize on said plate a configuration connected to a preceding sensitized configuration, one of said devices having means defining a horizontally positioned light slot, another of said devices having means defining a light slot positioned perpendicularly to said first light slot and being so positioned with respect to said first slot as to project an image perpendicular and connected to the image produced by said first slot, a means for supporting said light projection devices in spaced relation to said table, and means for moving said table and said last mentioned means relatively on axes at right angles to one another in any successive positioning operation.

(References on following page)

References Cited by the Examiner

UNITED STATES PATENTS

| | | | |
|---|---|---|---|
| 2,458,769 | 1/1949 | Debrie | 88—24 |
| 2,557,685 | 6/1951 | Rabinowitz | 88—24 |
| 2,698,562 | 1/1955 | Freund | 88—24 |
| 2,752,245 | 6/1956 | Hough et al. | 96—43 |
| 2,805,471 | 9/1957 | Lowden. | |
| 2,914,404 | 11/1959 | Fanselau | 96—35 |
| 2,972,533 | 2/1961 | Frankau et al. | 96—43 |
| 3,004,469 | 10/1961 | Broyer | 88—24 |
| 3,020,156 | 2/1962 | Rowe | 96—35 |
| 3,072,014 | 1/1963 | Rawstron | 88—24 |
| 3,122,075 | 2/1964 | Klyce et al. | 95—4.5 |

EVON C. BLUNK, *Primary Examiner.*

N. O. TORCHIN, NORTON ANSHER, *Examiners.*